United States Patent
Ruengeler et al.

(10) Patent No.: US 11,162,987 B2
(45) Date of Patent: Nov. 2, 2021

(54) METHOD FOR SEPARATING SPECTRUMS OF AN INPUT SIGNAL AS WELL AS MEASUREMENT DEVICES FOR SEPARATING SPECTRUMS

(71) Applicant: Rohde & Schwarz GmbH Co. KG, Munich (DE)

(72) Inventors: Matthias Ruengeler, Markt Schwaben (DE); Gregor Feldhaus, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 95 days.

(21) Appl. No.: 15/999,409

(22) Filed: Aug. 20, 2018

(65) Prior Publication Data

US 2020/0057100 A1    Feb. 20, 2020

(51) Int. Cl.
*G01R 23/167*    (2006.01)

(52) U.S. Cl.
CPC .................. *G01R 23/167* (2013.01)

(58) Field of Classification Search
CPC .................................................. G01R 23/167
See application file for complete search history.

(56) References Cited

U.S. PATENT DOCUMENTS

| 4,791,577 | A | * | 12/1988 | Winter | G01R 23/16 324/76.21 |
| 6,861,833 | B2 | * | 3/2005 | Miyauchi | G01R 23/173 324/76.19 |
| 7,313,492 | B2 | * | 12/2007 | Ortler | G01R 23/173 324/76.23 |
| 9,485,598 | B2 | | 11/2016 | Roth et al. | |
| 2013/0346028 | A1 | * | 12/2013 | Feldhaus | G06F 17/00 702/189 |

FOREIGN PATENT DOCUMENTS

DE    102011011978 A1    7/2012

* cited by examiner

*Primary Examiner* — Alexander Satanovsky
(74) *Attorney, Agent, or Firm* — Christensen O'Connor Johnson Kindness PLLC (57) ABSTRACT

A method for separating spectrums of an input signal having a first spectrum and a second spectrum by mixing the input signal at a first mixer with a first frequency to obtain a first mixed signal; mixing the input signal at a second mixer with second frequency to obtain a second mixed signal; displacing the first mixed signal and/or the second mixed signal up and down by the difference of the first and second frequency obtaining at least one lower auxiliary signal and at least one upper auxiliary signal, respectively; and extracting the first spectrum and/or the second spectrum using the lower auxiliary signal and/or the upper auxiliary signal as well as the first mixed signal and/or the second mixed signal. Further, measurement devices for separating spectrums are shown.

18 Claims, 5 Drawing Sheets

METHOD FOR SEPARATING SPECTRUMS OF AN INPUT SIGNAL AS WELL AS MEASUREMENT DEVICES FOR SEPARATING SPECTRUMS

FIELD OF THE DISCLOSURE

The disclosure relates to a method for separating spectrums of an input signal having a first spectrum and a second spectrum. The disclosure further relates to measurement devices for separating spectrums of an input signal having a first spectrum and a second spectrum.

BACKGROUND

Spectrum analyzers cover a wide range of center frequencies in order to analyze specific signals. Usually, mixers have mixing frequencies either below or above a center frequency of the desired spectrum that should be extracted from an input signal.

However, high mixing frequencies pose practical problems so that only mixing frequencies below the center frequency of the desired spectrum are used at the cost of image frequency reception.

SUMMARY

Thus, there is a need for a simple and high quality method and measuring devices for separating spectrums.

For this purpose or others, a method for separating spectrums of an input signal having a first spectrum and a second spectrum is provided, comprising the following steps:
 a) providing the input signal to a first mixing line comprising a first mixer having a first local oscillator, as well as providing the input signal to a second mixing line comprising a second mixer having a second local oscillator;
 b) mixing the input signal at the first mixer with a first mixing signal generated by the first local oscillator having a first frequency to obtain a first mixed signal, as well as mixing the input signal at the second mixer with a second mixing signal generated by the second local oscillator having a second frequency to obtain a second mixed signal, wherein the first frequency is different from the second frequency;
 c) filtering and digitizing of each of the mixed signal;
 d) feeding the first mixed signal and the second mixed signal to a common signal processing unit;
 e) displacing the first mixed signal and/or the second mixed signal up and/or down by the difference of the first frequency and the second frequency obtaining at least one lower auxiliary signal and/or at least one upper auxiliary signal, respectively; and
 f) extracting the first spectrum and/or the second spectrum using the lower auxiliary signal and/or the upper auxiliary signal, as well as the first mixed signal and/or the second mixed signal.

In the provided method, the problem of high mixing frequencies is avoided because the first mixing frequency and the second mixing frequency are both below the center frequency of the first spectrum, e.g. the desired spectrum. At the same time, the image frequency can be effectively attenuated because of the two paths, e.g., mixing lines with two different mixing frequencies.

Displacing may be performed by mixing and/or shifting by the common signal processing unit so that a reliable way of displacing the mixed signals is provided. The shift may be performed in post processing by the signal processing unit.

In an embodiment, the difference of the first frequency and the second frequency is based at least in part on the bandwidth of the input signal, the bandwidth of the first local oscillator, the bandwidth of the second local oscillator and/or the bandwidth of the signal processing unit. This way, the difference may be adjusted to various situations.

The first spectrum may be a desired spectrum and the second spectrum may be an image spectrum or vice versa so that a desired and/or image spectrum can be separated easily.

In order to provide a reliable measurement, the presence of the image spectrum in the input signal is detected and the user is informed of the presence of the image spectrum in the input signal. This may be done for example for IQ measurement.

In an aspect of the disclosure, the first frequency and the second frequency both lie between the first spectrum and the second spectrum, thus avoiding frequencies above the higher one of the spectra, for example above the desired spectrum.

In an embodiment of the disclosure, the first spectrum is extracted using the signal processing unit by:
 a) adding the first mixed signal to the upper auxiliary signal based on the second mixed signal to obtain a sum signal;
 b) subtracting the upper auxiliary signal based on the second mixed signal from the first mixed signal to obtain a difference signal; and
 c) subtracting the absolute value of the difference signal from the absolute value of the sum signal yielding the first spectrum.

This way, a simple and reliable way of separating the first spectrum, for example the power spectral density of the first spectrum, is provided.

The absolute value of the difference signal and the absolute value of the sum signal may be the power spectral densities of the difference signal and the sum signal, respectively.

In another aspect of the disclosure, the second spectrum is extracted using the signal processing unit by:
 a) adding the first mixed signal to the lower auxiliary signal based on the second mixed signal to obtain a sum signal;
 b) subtracting the lower auxiliary signal based on the second mixed signal from the first mixed signal to obtain a difference signal; and
 c) subtracting the absolute value of the difference signal from the absolute value of the sum signal yielding the second spectrum.

This way, a simple and reliable way of separating the second spectrum, for example the power spectral density of the second spectrum, is provided.

The absolute value of the difference signal and the absolute value of the sum signal may be the power spectral densities of the difference signal and the sum signal, respectively.

In another embodiment, the first spectrum and/or the second spectrum is extracted using the signal processing unit by:
 a) determining a first power spectral density being the power spectral density of the upper auxiliary signal based on the second mixed signal, and determining a second power spectral density being the power spectral density of the first mixed signal;
 b) from a starting point in the first power spectral density, determining a first spectral part of the first power spectral density originating from the first spectrum only, the first spectral part being an odd spectral part having a spectral length and a first spectral position;

c) subtracting the first spectral part from the second power spectral density, yielding a second spectral part at the first spectral position, the second spectral part being an even spectral part;

d) shifting the second spectral part by the spectral length to a subsequent spectral position;

e) subtracting the shifted second spectral part from the first power spectral density, yielding a third spectral part at the subsequent spectral position, the third spectral part being a further odd spectral part;

f) repeating steps c) to e) until subtracting a spectral part from the second power spectral density yields no further spectral part; and g) combining the first spectral part, the third spectral part and further odd spectral parts to obtain the first spectrum and/or combining the second spectral part and further even spectral parts to obtain the second spectrum.

By combining the spectral parts, the first and second spectrum may be reconstructed without effort.

The shifting may be in the direction of a process direction. Further, the spectral length may be the difference of the first frequency and the second frequency.

For example, the starting point may be at the left, the right or in the middle of the first power spectral density.

In order to quickly find a first spectral part, the first spectral part of the first power spectral density originating from the first spectrum only is determined based upon a frequency of an additive zero in the first mixed signal.

In yet another embodiment, the first spectrum is extracted using the signal processing unit by:

a) choosing the second frequency smaller than the first spectrum such that the lower auxiliary signal based on the second mixed signal comprises the second spectrum only; and b) subtracting the lower auxiliary signal based on the second mixed signal from the first mixed signal to obtain the first spectrum.

This way, an IQ measurement on the input signal may be performed.

For example, the location of the first spectrum is identified beforehand. Further, the lower auxiliary signal may be mixed up to where the first spectrum is located.

In order to provide the separated spectrum to the user, the first spectrum and/or the second spectrum in some embodiments is displayed at a display unit.

For a measurement of arbitrary signals, the first mixing line and the second mixing line are realized as separate hardware mixing lines used simultaneously.

In another embodiment, a single hardware mixing line is used alternatingly as the first mixing line and the second mixing line for periodic signals, wherein the first mixed signal and the second mixed signal are aligned in time and phase in the signal processing unit. This way, a cost-efficient setup is realized.

Further, for the above-mentioned purpose, a measurement device for separating a spectrum of an input signal having a first spectrum and a second spectrum is provided, comprising a signal input; a first measurement line connected to the signal input having a first mixer with a first local oscillator; a second measurement line connected to the signal input having a second mixer with a second local oscillator; and a common signal processing unit, wherein the first measurement line and the second measurement line are both connected to the common signal processing unit.

The measurement device in some embodiments may comprise a display unit.

For example, the first and second measurement lines each comprise a filter, especially an anti-aliasing filter, and/or an analog-to-digital converter. In some embodiments, the signal processing unit may be a digital signal processing unit.

In an embodiment, the common signal processing unit is configured to:

a) displace the first mixed signal and/or the second mixed signal up and down by the difference of the first frequency and the second frequency obtaining at least one lower auxiliary signal and at least one upper auxiliary signal, respectively; and b) extract the first spectrum and/or the second spectrum using the lower auxiliary signal and/or the upper auxiliary signal, as well as the first mixed signal and/or the second mixed signal.

This way, a spectrum may be separated efficiently and reliably.

Further, for the above-mentioned purpose, a measurement device for separating a spectrum of a periodic input signal having a first spectrum and a second spectrum is provided, comprising a signal input; a mixing line connected to the signal input having a mixer with a local oscillator; and a signal processing unit, wherein the mixing line is connected to the signal processing unit, wherein the local oscillator is configured to generate a first mixing signal having a first frequency for creating a first mixed signal and a second mixing signal having a second frequency for creating a second mixed signal, wherein the local oscillator alternates between the first frequency and the second frequency with the period of the periodic input signal or a multiple thereof, and wherein the signal processing unit is configured to align the first mixed signal and the second mixed signal in time and phase.

Of course, each feature mentioned in context of the method is also a feature of the measurement devices and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
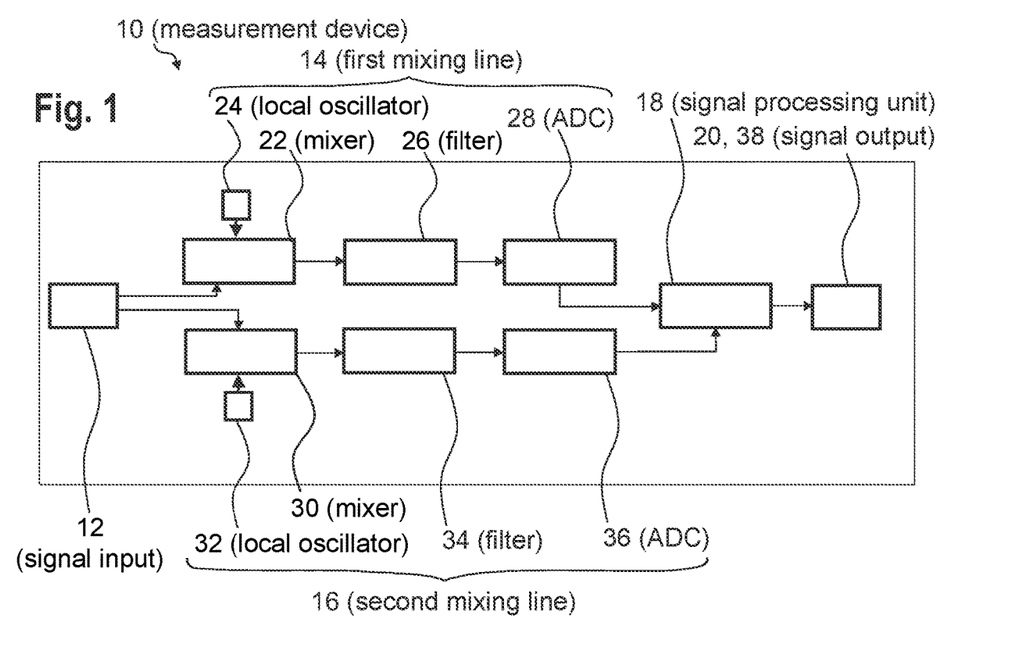
FIG. 1 shows schematically a first embodiment of a measurement device according to the disclosure.

FIG. 1 shows a measurement device 10 schematically. The measuring device may be a signal analyzer or a spectrum analyzer. As shown in FIG. 1, the measurement device 10 comprises in some embodiments a signal input 12, a first mixing line 14 and a second mixing line 16, a common signal processing unit 18 and a signal output 20.

In some embodiments, the first mixing line 14 comprises a first mixer 22 and a first local oscillator 24 providing a first mixing signal with a first frequency $f_1$ to the first mixer 22. The first mixing line 14 in some embodiments further comprises a filter 26, for example an anti-aliasing filter, and a first analog-to-digital converter 28. In the same way, the second mixing line 16 in some embodiments comprises a second mixer 30 that is fed by a second local oscillator 32 configured to generate a second mixing signal having a second frequency $f_2$. The second mixing line 16 in some embodiments further comprises a filter 34, for example also an anti-aliasing filter, and an analog-to-digital converter 36.

The first mixing line 14 and the second mixing line 16 are both connected to the signal input 12, more precisely the first mixer 22 and the second mixer 30 are both connected to the signal input 12. At the other ends of the mixing lines 14, 16, the first and second mixing lines 14, 16 are both connected to the common signal processing unit 18. In the shown embodiment, the analog-to-digital converters 28, 36 of the mixing lines 14, 16 are electrically connected to the signal processing unit 18.

The signal processing unit 18 may be a digital signal processing unit and it is configured to receive and process the signals received from the first mixing line 14 and the second mixing line 16. Of course, in other embodiments, the logic of the digital signal processing unit for implementing the technologies and methodologies described herein can be carried out in either hardware or software, or a combination of hardware and software. For example, in some embodiments, the signal processing unit 18 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the signal processing unit 18 includes a microprocessor and a memory storing logic modules and/or instructions. In an embodiment, the signal processing unit 18 includes one or more ASICs having a plurality of predefined logic components. In an embodiment, the signal processing unit 18 includes one or more FPGA having a plurality of programmable logic components. In an embodiment, the signal processing unit 18 includes hardware circuit implementations (e.g., implementations in analog circuitry, implementations in digital circuitry, and the like, and combinations thereof). In an embodiment, the signal processing unit 18 includes combinations of circuits and computer program products having software or firmware instructions stored on one or more computer readable memories that work together to cause a device to perform one or more methodologies or technologies described herein.

The signal processing unit 18 is also connected to the signal output 20 in order to output the signal extracted by the signal processing unit 18. The signal output 20 may be, for example, a display unit 38 and/or any other output like an electric terminal.

Figure 2:
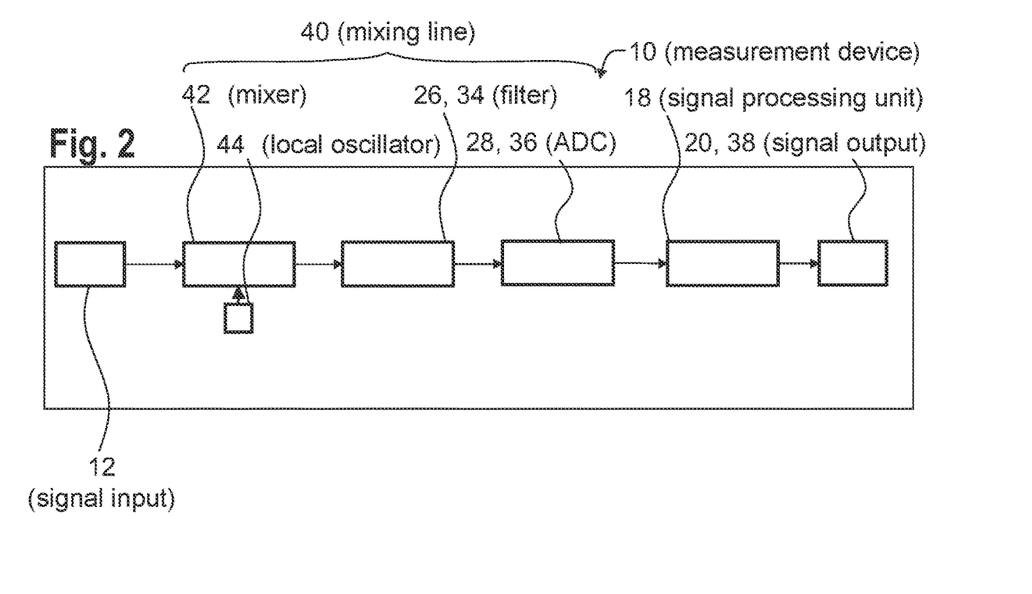
FIG. 2 shows schematically a second embodiment of a measurement device according to the disclosure.

FIG. 2 shows a second embodiment of the measurement device being essentially identical to the measurement device 10 of the first embodiment so that only the differences are explained. Thus, the same and functionally alike parts are labeled with the same reference signs.

In the second embodiment, the first mixing line 14 and the second mixing line 16 are provided as a single hardware mixing line 40 with a single mixer 42. The mixer 42 has a single local oscillator 44 that fulfills the functions of the first local oscillator 24 and the second local oscillator 32 alternatingly. The local oscillator 44 is able to generate the first mixing signal with the first frequency $f_1$ and the second mixing signal with the second frequency $f_2$ alternatingly with the period of the signal input at the signal input 12 or a multiple thereof.

The measurement device 10 of the first and second embodiment are used to a separate spectrum of an input signal that comprises at least two spectra.

Figure 3A:
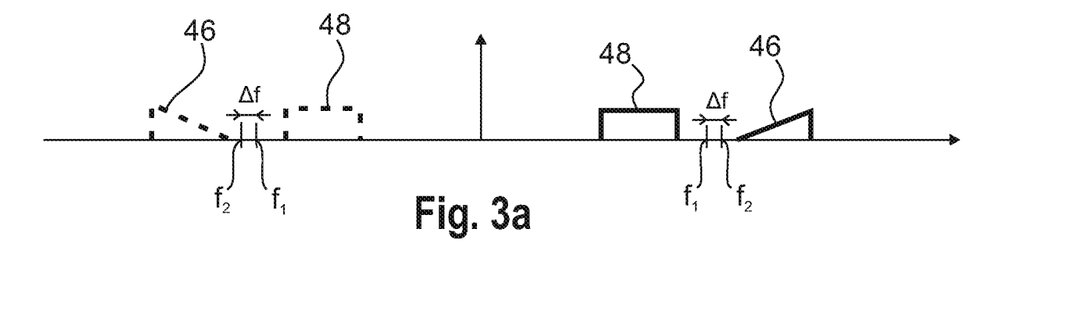
FIGS. 3a-3g show schematically signals used in a representative method according to the disclosure.

FIG. 3a shows a simplified example of such a signal in the frequency domain. As can be seen, the input signal has a first spectrum 46 and second spectrum 48. The first spectrum 46 may be a desired spectrum. In the shown embodiment, the desired spectrum has a triangular shape. The second spectrum 48 may be an image spectrum. The image spectrum has a rectangular shape in the shown embodiment and frequencies lower than the frequencies of the first spectrum 46. Of course, the first spectrum 46 may also be the image spectrum and the second spectrum 48 may be the desired spectrum.

The input signal is fed to the signal input 12 and thus received by the first mixing line 14 and the second mixing line 16. The first frequency $f_1$ of the first local oscillator 24 is set to a frequency exactly between the two spectra 46, 48. The second frequency $f_2$ of the second local oscillator 32 is also located between the two spectra 46, 48 but chosen a bit higher than the first frequency $f_1$. Thus, the first frequency $f_1$ and the second frequency $f_2$ differ from one another by a difference $\Delta f = f_2 - f_1$.

The difference $\Delta f$ of the first frequency $f_1$ and the second frequency $f_2$ is thus based on the bandwidth of the input signal, the bandwidth of the first local oscillator 24 and the bandwidth of the second local oscillator 32. The frequency difference $\Delta f$ may also be chosen depending on the bandwidth of the signal processing unit 18.

Figure 3B:
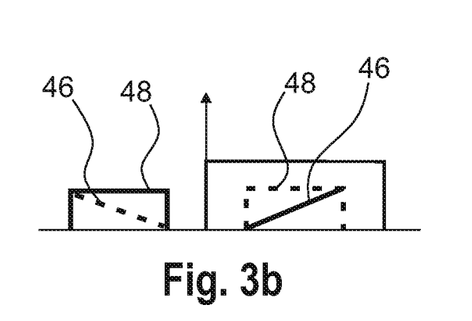

In the first mixing line 14, the input signal is incident at the first mixer 22, which is also fed by the first mixing signal with the first frequency $f_1$ from the first local oscillator 24. In the first mixer 22 the input signal and the first mixing signal are mixed yielding a first mixed signal as shown in FIG. 3b. Likewise, in the second mixing line 16 the input signal is incident at the second mixer 30 and being mixed with the second mixing signal having the frequency $f_2$ fed to the second mixer 30 by the second local oscillator 32.

Figure 3C:
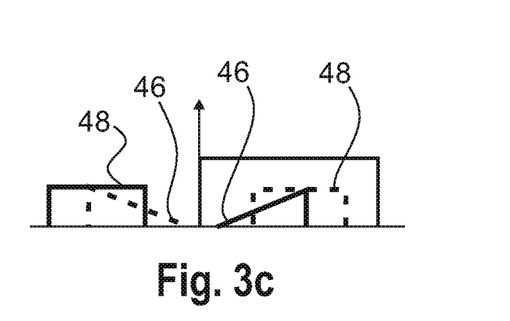

FIGS. 3b and 3c show the down-mixed parts of the first mixed signal obtained at the first mixer 22 and of the second mixed signal obtained at the second mixer 30, respectively. In the FIGURES, the black rectangle illustrates the intermediate frequency sector.

Figure 3D:
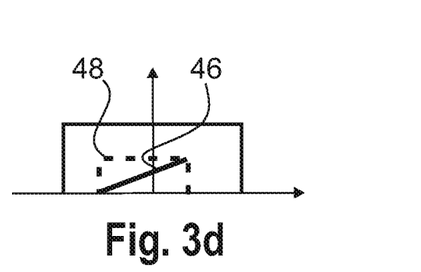
Figure 3E:
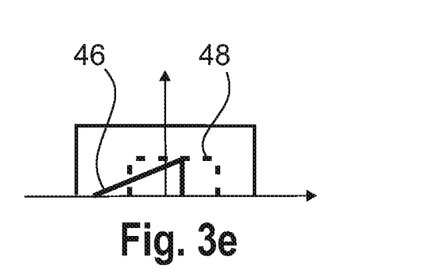

Both the first mixed signal and the second mixed signal are, for example, filtered using the filters 26, 34, respectively, to yield the first mixed signal and the second mixed signal shown in FIGS. 3d and 3e. The mixed signals shown in FIGS. 3d and 3e are then fed to the signal processing unit 18 using the analog-to-digital converters 28, 36 of the respective mixing line 14, 16.

In the measurement device 10 of the first embodiment, the processing of the input signal in the first mixing line 14 and the second mixing line 16 happen simultaneously. In the measurement device 10 of the second embodiment, however, the input signal is a periodic signal and the first mixed signal is obtained by mixing the input signal and the mixer 42 with a mixing signal having the first frequency $f_1$ for a first period of time corresponding to a single period of the periodic signal or multiple periods of the periodic signal. In order to obtain the second mixed signal in a second period of time corresponding to a single period of the periodic signal or multiples thereof, the input signal is mixed at the mixer 42 with a mixing frequency having the second frequency $f_2$. Thus, the signal processing unit 18 does not receive the first mixed signal and the second mixed signal simultaneously but subsequently or serially.

Therefore, the signal processing unit 18 is configured to align the first mixed signal and the second mixed signal in time and phase in order to end up with a first mixed signal and a second mixed signal just as received from the measurement device 10 of the first embodiment. Thereafter, the signal processing of the signal processing unit 18 can be identical for the measurement device 10 of the first embodiment and of the second embodiment.

Figure 3F:
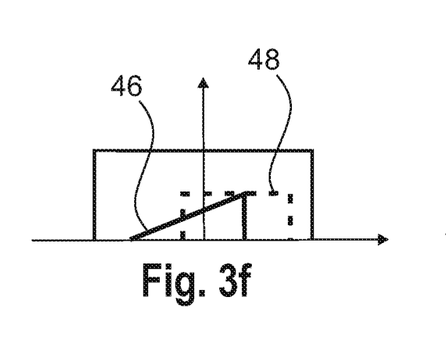
Figure 3G:
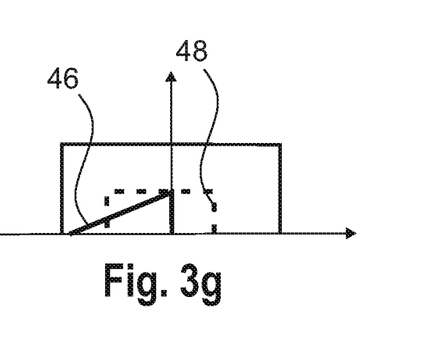

In the representative method, the second mixed signal is then displaced by the signal processing unit 18. More precisely, the second mixed signal is mixed up and down with the frequency $\Delta f$ in order to obtain an upper auxiliary signal and a lower auxiliary signal based on the second mixed signal. The upper auxiliary signal and the lower auxiliary signal are shown in FIGS. 3f and 3g, respectively. Of course, the auxiliary signals may also be created based on the first mixed signal or on both mixed signals.

The displacing may be performed using mixing of the mixed signals or shifting the mixed signals accordingly. This could be done by either an additional mixer or by post-processing of the respective digitized signal. The auxiliary signals and/or the mixed signals are used, for example to extract the first spectrum 46 and/or the second spectrum 48 from the input signal using different embodiments of the method.

Figure 4A:
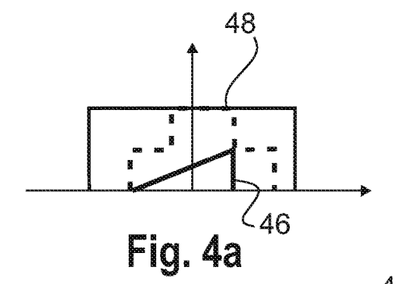
FIGS. 4a-4c show schematically signals during a first embodiment of the extraction process of a spectrum according to a method of the disclosure.
Figure 4B:
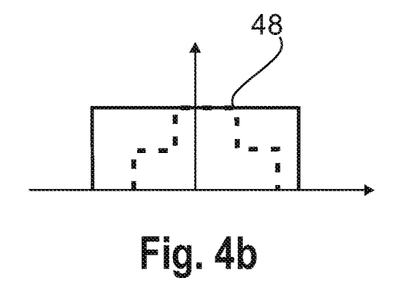
Figure 4C:
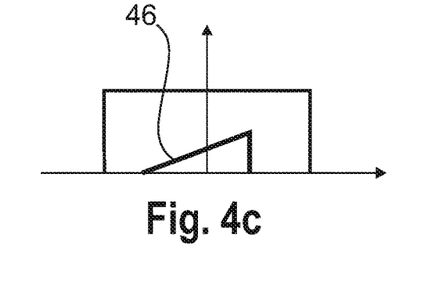

A first embodiment of the method for extracting a spectrum is illustrated in FIGS. 4a to 4c. In the shown example of the first embodiment of the method, in a first step, the first mixed signal is added to the upper auxiliary signal based on the second mixed signal so that a sum signal is obtained as shown in FIG. 4a. In a second step, which may be carried out simultaneously, before or after the first step, the upper auxiliary signal based on the second mixed signal is subtracted from the first mixed signal to obtain a difference signal as shown in FIG. 4b. In FIGS. 4a and 4b, only the absolute value or the power spectral density of the sum signal or the difference signal are shown.

The first spectrum 46, namely the desired spectrum, is obtained by subtracting the absolute value of the difference signal from the absolute value of the sum signal, yielding the absolute value or power spectral density of the second spectrum 48 as shown in FIG. 4c. Thus, the first spectrum 46 is easily separated and the second spectrum 48 is attenuated with common local oscillators 24, 32 from the input signal.

Figure 5A:
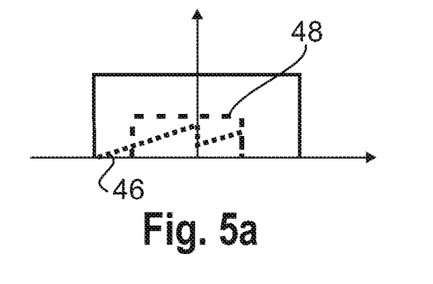
FIGS. 5a-5c show schematically signals during a second embodiment of the extraction process of a spectrum according to a method of the disclosure.
Figure 5B:
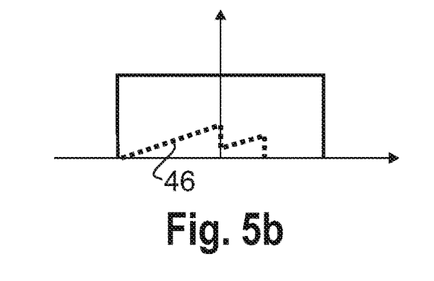
Figure 5C:
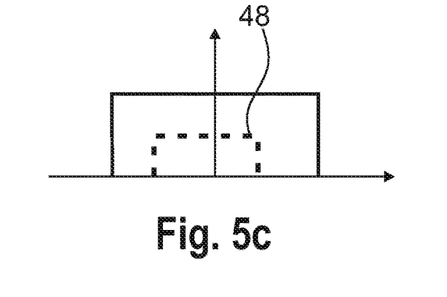

A second embodiment of the method is illustrated in FIGS. 5a to 5c. In this embodiment, the second spectrum 48 is extracted in similar fashion as the first spectrum 46 in the embodiment according to FIGS. 4a to 4c.

FIGS. 5a and 5b show the absolute value of the sum signal and the difference signal, respectively. In the second embodiment, the first mixed signal is added to the auxiliary signal based on the second mixed signal to obtain a sum signal as shown in FIG. 5a. Likewise, the lower auxiliary signal is subtracted from the first mixed signal to obtain a difference signal as shown in FIG. 5b.

In the next step, the absolute value of the difference signal is then subtracted from the absolute value of the sum signal yielding the second spectrum 48, being the image spectrum in the shown example. Of course, the absolute value or power spectral density of the second spectrum 48 is obtained.

A third embodiment of the method is illustrated in FIGS. 6a-6f. In this third embodiment, a first power spectral density 50 and a second power spectral density 52 are determined. The first power spectral density is the power spectral density of the upper auxiliary signal based on the second mixed signal and the second power spectral density 52 is the power spectral density of the first mixed signal.

Figure 6A:
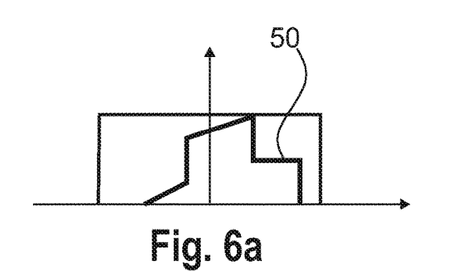
FIGS. 6a-6f show schematically signals during a third embodiment of the extraction process of a spectrum according to a method of the disclosure.
Figure 6B:
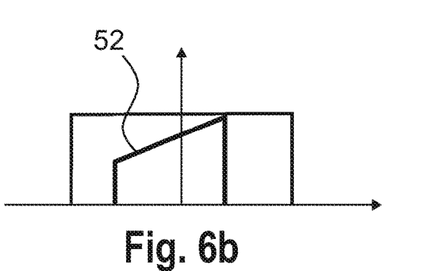

The first power spectral density 50 is shown in FIG. 6a and the second power spectral density 52 is shown in FIG. 6b. Using the first power spectral density, a starting point S is determined. The starting point S is the beginning of a first spectral part P1 of the first power spectral density 50 that originated from only one of the first spectrum 46 and the second spectrum 48, e.g., having parts of only one of the spectra 46, 48.

This first spectral part P1 may be identified using a known zero of the first spectrum 46 or the second spectrum 48, for example in an intermediate frequency. The first spectral part has a spectral length, preferably being the frequency difference $\Delta f$, and a first spectral position, usually defined by the starting point S.

The starting point S is then preferably the end of the first spectral part P1 that is not adjacent to further spectral parts of the first power spectral density 50. In the shown embodiment, the starting point S is at the left-hand side, e.g., the lower frequency side of the first power spectral density 50. The starting point S may also be at the right-hand side or in the middle of the first power spectral density 50.

Figure 6C:
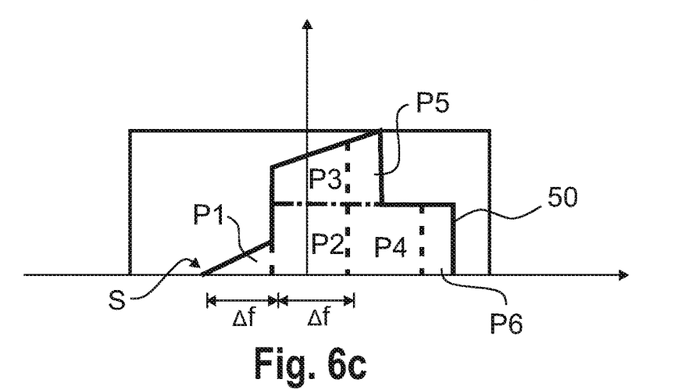
Figure 6D:
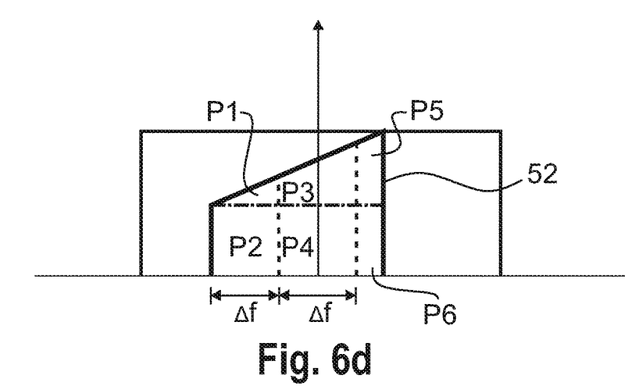

FIG. 6c illustrates the first power spectral density 50 with its spectral parts and FIG. 6d illustrates the second power spectral density 52. After having identified the first spectral part P1 in the first power spectral density 50, the spectral part is subtracted from the second power spectral density 52. Figuratively speaking, the spectral part P1 is "chipped off" the second power spectral density 52.

In the spectral length of the first spectral part P1 a second spectral part P2 of the second power spectral density 52 remains at the first spectral position. The second spectral part P2 is then shifted by the spectral length. The shifting is performed in the process direction being the direction towards higher frequencies in the shown embodiment. Then, the second spectral part P2 is subtracted from the first power spectral density 50 as indicated in the upper half of FIG. 6f.

Figure 6E:
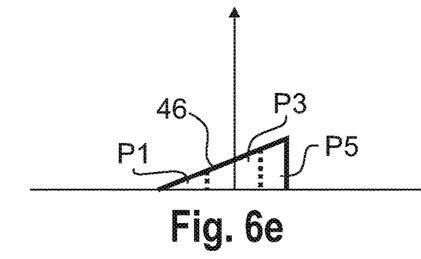
Figure 6F:
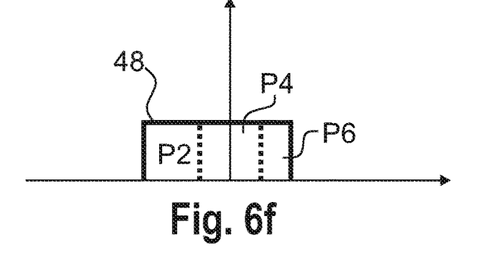

This yields a third spectral part P3 of the first power spectral density 50 having a spectral length equal to the spectral length of the first spectral part P1 but its spectral position shifted by one spectral length to a subsequent spectral position. The third spectral part P3 is then again subtracted from the second power spectral density 52 yielding a remaining fourth spectral part P4 at the spectral position of the third spectral part P3.

The fourth spectral part P4 is then shifted and subtracted from the first power spectral density 50 as explained above, yielding a fifth spectral part P5. This fifth spectral part P5 is then subtracted from the second power spectral density 52 yielding a remaining sixth spectral part of the second power spectral density 52. If this spectral part is subtracted from the first power spectral density 50, no further spectral part of the first power spectral density 50 remains. Thus, the subtraction of spectral parts ends here.

In order to construct the first spectrum 46, the odd spectral parts, namely the first spectral part P1, the third spectral part P3 and the fifth spectral part P5 are combined. This gives the first spectrum 46 as shown in FIG. 6e. Likewise, the even spectral parts, namely the second spectral part P2, the fourth spectral part P4 and the sixth spectral part P6, may be combined to obtain the second spectrum 48 as shown in FIG. 6f. Thus, the third embodiment provides another method for extracting either one or both of the spectra 46, 48 from the input signal in an easy fashion.

Figure 7A:
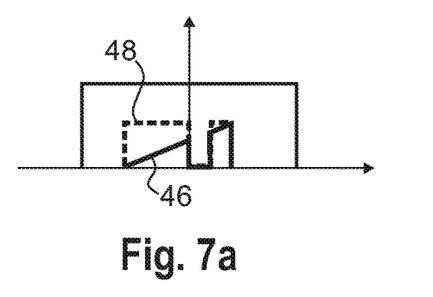
FIGS. 7a-7b illustrate the detection of a starting point for the method set forth in FIGS. 6a-6f.
Figure 7B:
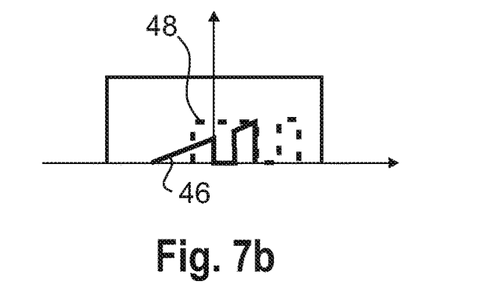

FIGS. 7a and 7b show a way of determining the first spectral part P1 based on additive zeroes. This can be seen in FIG. 7a, showing the first mixed signal. An additive zero, e.g., a power spectral density with zero is present at a specific frequency. Thus, in the corresponding auxiliary signal shown in FIG. 7b, two spectral parts exist originating only from one of the spectra 46, 48. The spectral location of these parts depends on the shift performed to obtain the auxiliary signal. Thus, the location of these parts is known.

Figure 8A:
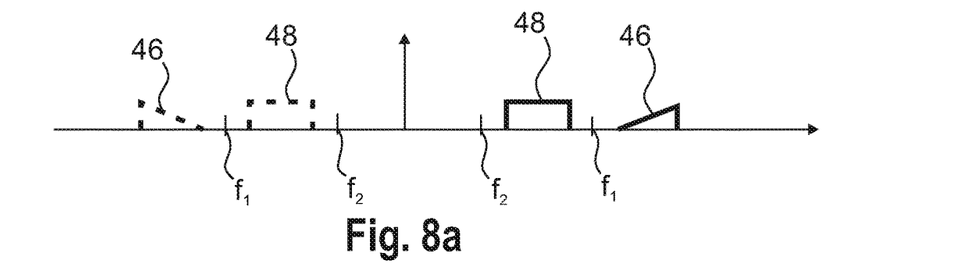
FIGS. 8a-8d show schematically signals during a fourth embodiment of the extraction process of a spectrum according to a method of the disclosure.
Figure 8B:
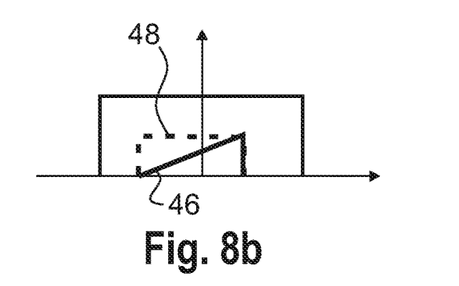
Figure 8C:
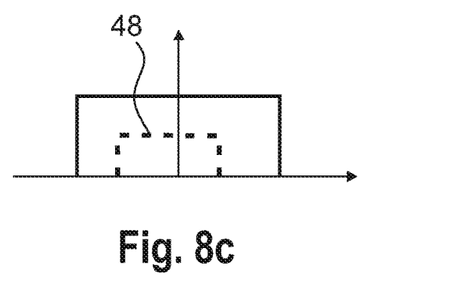

A fourth embodiment of a method to extract a spectrum 46, 48 from the input signal is illustrated in FIGS. 8a to 8d. In this embodiment, the location of the first spectrum 46 is identified beforehand and provided to the measurement device 10. The second frequency $f_2$ is then chosen smaller than the first spectrum 46 (FIG. 8a) such that the lower auxiliary signal based on the second mixed signal comprises the second spectrum 48 only (FIG. 8c). In other words, the image signal is mixed up to where the first spectrum 46 is located.

Figure 8D:
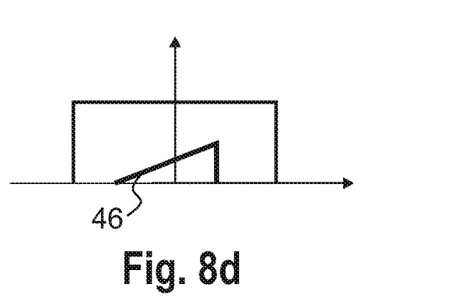

The lower auxiliary signal (FIG. 8b) is then subtracted from the first mixed signal (FIG. 8a) to obtain the first spectrum 46 shown in FIG. 8d. This way, even IQ signals containing IQ data may be processed.

In all of the above embodiments, the extracted first spectrum 46 and/or second spectrum 48 is outputted via the signal output 20. For example, the first spectrum 46 and/or the second spectrum 48 is displayed at the display unit 38.

Further, the measurement device 10 may detect the presence of an image spectrum in the input signal, for example if the input signal is an IQ signal, and then informs the user about the presence of the image signal.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for separating spectrums of an input signal having a first spectrum and a second spectrum, the method comprising the following steps:
   a) providing an input signal to a first mixing line comprising a first mixer having a first local oscillator, as well as providing said input signal to a second mixing line comprising a second mixer having a second local oscillator, said input signal having the first spectrum and the second spectrum;
   b) mixing said input signal at said first mixer with a first mixing signal generated by said first local oscillator having a first frequency to obtain a first mixed signal, as well as mixing said input signal at said second mixer with a second mixing signal generated by said second local oscillator having a second frequency to obtain a second mixed signal, wherein said first frequency is different from said second frequency;
   c) filtering and digitizing of each of said mixed signals;
   d) feeding said first mixed signal and said second mixed signal to a common signal processing unit;
   e) displacing at least one of said first mixed signal and said second mixed signal up and down by the difference of said first frequency and said second frequency obtaining at least one lower auxiliary signal and at least one upper auxiliary signal, respectively; and
   f) extracting at least one of said first spectrum or said second spectrum using at least one of said lower auxiliary signal or said upper auxiliary signal, as well as using at least one of said first mixed signal or said second mixed signal, wherein said first frequency and said second frequency both lie between said first spectrum and said second spectrum.

2. The method according to claim 1, wherein displacing is performed by at least one of mixing or shifting by said common signal processing unit.

3. The method according to claim 1, wherein said difference of said first frequency and said second frequency is based at least in part on at least one of the bandwidth of said input signal, the bandwidth of said first local oscillator, the bandwidth of said second local oscillator or the bandwidth of said signal processing unit.

4. The method according to claim 1, wherein the presence of an image spectrum is detected and the user is informed of the presence of said image spectrum in said input signal.

5. The method according to claim 1, wherein said first spectrum is extracted using said signal processing unit by:
   i. adding said first mixed signal to said upper auxiliary signal based on said second mixed signal to obtain a sum signal;
   ii. subtracting said upper auxiliary signal based on said second mixed signal from said first mixed signal to obtain a difference signal; and
   iii. subtracting the absolute value of said difference signal from the absolute value of said sum signal yielding said first spectrum.

6. The method according to claim 5, wherein said absolute value of said difference signal and said absolute value of said sum signal are the power spectral densities of said difference signal and said sum signal, respectively.

7. The method according to claim 1, wherein said second spectrum is extracted using said signal processing unit by:

i. adding said first mixed signal to said lower auxiliary signal based on said second mixed signal to obtain a sum signal;
ii. subtracting said lower auxiliary signal based on said second mixed signal from said first mixed signal to obtain a difference signal; and
iii. subtracting the absolute value of said difference signal from the absolute value of said sum signal yielding said second spectrum.

8. The method according to claim 7, wherein said absolute value of said difference signal and said absolute value of said sum signal are the power spectral densities of said difference signal and said sum signal, respectively.

9. The method according to claim 1, wherein at least one of said first spectrum or said second spectrum is extracted using said signal processing unit by:
i. determining a first power spectral density being the power spectral density of said upper auxiliary signal based on said second mixed signal, and determining a second power spectral density being the power spectral density of said first mixed signal;
ii. from a starting point in the first power spectral density, determining a first spectral part of said first power spectral density originating from said first spectrum only, said first spectral part being an odd spectral part having a spectral length and a first spectral position;
iii. subtracting said first spectral part from said second power spectral density, yielding a second spectral part at said first spectral position, said second spectral part being an even spectral part;
iv. shifting said second spectral part by said spectral length to a subsequent spectral position;
v. subtracting said shifted second spectral part from said first power spectral density, yielding a third spectral part at said subsequent spectral position, said third spectral part being a further odd spectral part;
vi. repeating steps iii) to v) until subtracting a spectral part from said second power spectral density yields no further spectral part; and
vii. at least one of combining said first spectral part, said third spectral part and further odd spectral parts to obtain said first spectrum or combining said second spectral part and further even spectral parts to obtain said second spectrum.

10. The method according to claim 9, wherein said starting point is located at the left, at the right or in the middle of said first power spectral density.

11. The method according to claim 9, wherein said first spectral part of said first power spectral density originating from said first spectrum only is determined based upon a frequency of an additive zero in said first mixed signal.

12. The method according to claim 1, wherein said first spectrum is extracted using said signal processing unit by:
i. choosing said second frequency smaller than said first spectrum such that said lower auxiliary signal based on said second mixed signal comprises said second spectrum only; and
ii. subtracting said lower auxiliary signal based on said second mixed signal from said first mixed signal to obtain said first spectrum.

13. The method according to claim 1, wherein at least one of said first spectrum or said second spectrum is displayed at a display unit.

14. The method according to claim 1, wherein said first mixing line and said second mixing line are realized as separate mixing lines used simultaneously.

15. The method according to claim 1, wherein a single mixing line is used alternatingly as said first mixing line and said second mixing line for periodic signals, wherein said first mixed signal and said second mixed signal are aligned in time and phase in said signal processing unit.

16. A measurement device for separating spectrums of an input signal having a first spectrum and a second spectrum, comprising:
a signal input configured to receive an input signal having a first spectrum and a second spectrum;
a first measurement line connected to said signal input having a first mixer with a first local oscillator, wherein said first mixer is configured to mix said input signal with a first mixing signal generated by said first local oscillator having a first frequency to obtain a first mixed signal;
a second measurement line connected to said signal input having a second mixer with a second local oscillator, wherein said second mixer is configured to mix said input signal with a second mixing signal generated by said second local oscillator having a second frequency to obtain a second mixed signal; and
a common signal processing unit, wherein said first measurement line and said second measurement line are both connected to said common signal processing unit so that said common signal processing unit receives said first mixed signal and second mixed signal, wherein said first frequency and said second frequency both lie between said first spectrum and said second spectrum.

17. The measurement device according to claim 16, wherein said common signal processing unit is configured to:
i. displace at least one of said first mixed signal or said second mixed signal up and down by the difference of said first frequency and said second frequency obtaining at least one lower auxiliary signal and at least one upper auxiliary signal, respectively; and
ii. extract at least one of said first spectrum or said second spectrum using at least one of said lower auxiliary signal or said upper auxiliary signal, as well as at least one of said first mixed signal or said second mixed signal.

18. A measurement device for separating spectrums of a periodic input signal having a first spectrum and a second spectrum, comprising:
a signal input configured to receive an input signal having a first spectrum and a second spectrum;
a mixing line connected to said signal input having a mixer with a local oscillator; and
a signal processing unit, wherein said mixing line is connected to said signal processing unit,
wherein the local oscillator is configured to generate a first mixing signal having a first frequency for creating a first mixed signal and a second mixing signal having a second frequency for creating a second mixed signal, and wherein said local oscillator is configured to alternate between said first frequency and said second frequency with the period of said periodic input signal or a multiple thereof,
wherein the signal processing unit is configured to align said first mixed signal and said second mixed signal in time and phase, and
wherein said first frequency and said second frequency both lie between said first spectrum and said second spectrum.

* * * * *